United States Patent
Nordgran et al.

(10) Patent No.: US 10,148,341 B2
(45) Date of Patent: Dec. 4, 2018

(54) INDEPENDENT BAND DETECTION FOR NETWORK PROTECTION

(71) Applicant: WILSON ELECTRONICS, LLC, St. George, UT (US)

(72) Inventors: Casey James Nordgran, Washington, UT (US); Christopher Ken Ashworth, St. George, UT (US); Patrick Lee Cook, Cedar City, UT (US)

(73) Assignee: WILSON ELECTRONICS, LLC, St. George, UT (US)

( * ) Notice: Subject to any disclaimer, the term of this patent is extended or adjusted under 35 U.S.C. 154(b) by 0 days.

(21) Appl. No.: 15/887,909

(22) Filed: Feb. 2, 2018

(65) Prior Publication Data
US 2018/0219610 A1 Aug. 2, 2018

Related U.S. Application Data

(60) Provisional application No. 62/569,337, filed on Oct. 6, 2017, provisional application No. 62/453,904, filed on Feb. 2, 2017.

(51) Int. Cl.
*H04B 7/15* (2006.01)
*H04B 7/155* (2006.01)
(Continued)

(52) U.S. Cl.
CPC ......... *H04B 7/15507* (2013.01); *H01Q 1/241* (2013.01); *H03F 3/195* (2013.01);
(Continued)

(58) Field of Classification Search
CPC .. H04B 7/15507; H04B 1/0053; H04B 1/006; H04B 7/15535; H04B 7/2606;
(Continued)

(56) References Cited

U.S. PATENT DOCUMENTS 3,332,038 A 7/1967 Stanley et al.
4,776,032 A 10/1988 Odate et al.
(Continued)

FOREIGN PATENT DOCUMENTS

EP 1525678 B1 7/2008
EP 2757708 A1 7/2014
(Continued)

OTHER PUBLICATIONS

ADL5513; "1 MHz to 4 GHz, 80 dB Logarithmic Detector / Controller"; Data Sheet; (2008); 25 pages.
(Continued)

*Primary Examiner* — Dominic E Rego
(74) *Attorney, Agent, or Firm* — Thorpe North & Western

(57) ABSTRACT

Technology for a cellular signal booster operable to amplify cellular signals is disclosed. The cellular signal booster can include a downlink cellular signal path configured to amplify and filter a received downlink cellular signal in a plurality of selected bands. The downlink signal path can combine at least a first band and a second band in the plurality of selected bands. The cellular signal booster can include a controller operable to perform network protection by adjusting an uplink gain or noise power for at least one of a first band or a second band in an uplink signal path. The uplink gain or noise power can be adjusted for the first band in the uplink signal path or the second band in the uplink signal path using a signal strength associated with the received downlink cellular signal on the downlink cellular signal path.

21 Claims, 8 Drawing Sheets

(51) Int. Cl.
| | |
|---|---|
| *H04B 1/00* | (2006.01) |
| *H01Q 1/24* | (2006.01) |
| *H03F 3/195* | (2006.01) |
| *H04B 7/26* | (2006.01) |
| *H04W 16/26* | (2009.01) |
| *H04B 1/3888* | (2015.01) |
| *H04W 52/24* | (2009.01) |

(52) U.S. Cl.
CPC .......... *H04B 1/006* (2013.01); *H04B 1/0053* (2013.01); *H04B 7/15535* (2013.01); *H04B 7/15542* (2013.01); *H04B 7/2606* (2013.01); *H04W 16/26* (2013.01); *H01Q 1/243* (2013.01); *H04B 1/3888* (2013.01); *H04W 52/245* (2013.01)

(58) Field of Classification Search
CPC . H04B 1/3888; H04B 7/15542; H04W 16/26; H04W 52/245; H01Q 1/241; H03F 3/195
See application file for complete search history.

(56) References Cited

U.S. PATENT DOCUMENTS

| | | | |
|---|---|---|---|
| 5,303,395 A | 4/1994 | Dayani | |
| 5,737,687 A | 4/1998 | Martin et al. | |
| 5,777,530 A | 7/1998 | Nakatuka | |
| 5,809,398 A * | 9/1998 | Moberg | H04B 7/15542 455/17 |
| 5,835,848 A | 11/1998 | Bi et al. | |
| 6,005,884 A | 12/1999 | Cook et al. | |
| 6,041,216 A | 3/2000 | Rose et al. | |
| 6,615,021 B1 * | 9/2003 | Lovinggood | H04B 7/15507 340/7.21 |
| 6,690,916 B1 | 2/2004 | Yenerim | |
| 6,711,388 B1 | 3/2004 | Neitiniemi | |
| 6,889,033 B2 | 5/2005 | Bongfeldt | |
| 6,990,313 B1 | 1/2006 | Yarkosky | |
| 7,035,587 B1 | 4/2006 | Yarkosky | |
| 7,221,967 B2 | 5/2007 | Van Buren et al. | |
| 7,706,744 B2 | 4/2010 | Rodgers et al. | |
| 7,974,573 B2 | 7/2011 | Dean | |
| 7,986,647 B2 | 7/2011 | Ghadaksaz | |
| 8,290,430 B2 | 10/2012 | Pergal | |
| 8,380,136 B2 | 2/2013 | Nast et al. | |
| 8,457,021 B2 | 6/2013 | Schiff | |
| 8,755,399 B1 | 6/2014 | Van Buren et al. | |
| 8,867,572 B1 * | 10/2014 | Zhan | H04W 16/26 370/497 |
| 8,937,874 B2 | 1/2015 | Gainey et al. | |
| 2002/0044594 A1 | 4/2002 | Bongfeldt | |
| 2003/0073423 A1 * | 4/2003 | Cho | H04B 1/109 455/324 |
| 2003/0123401 A1 | 7/2003 | Dean | |
| 2004/0137854 A1 | 7/2004 | Ge | |
| 2004/0146013 A1 | 7/2004 | Song et al. | |
| 2004/0166802 A1 * | 8/2004 | McKay, Sr. | H04B 7/15535 455/15 |
| 2004/0219876 A1 | 11/2004 | Baker et al. | |
| 2004/0235417 A1 | 11/2004 | Dean | |
| 2004/0246074 A1 | 12/2004 | Humphrey | |
| 2005/0026571 A1 | 2/2005 | Yang et al. | |
| 2005/0118949 A1 | 6/2005 | Allen et al. | |
| 2006/0019603 A1 | 1/2006 | Pergal | |
| 2006/0084379 A1 | 4/2006 | O'Neill | |
| 2006/0205442 A1 | 9/2006 | Phillips et al. | |
| 2007/0071128 A1 | 3/2007 | Meir et al. | |
| 2007/0087715 A1 * | 4/2007 | Mimura | H04B 1/7174 455/255 |
| 2007/0188235 A1 | 8/2007 | Dean | |
| 2007/0202826 A1 | 8/2007 | Dean | |
| 2007/0218951 A1 | 9/2007 | Risheq et al. | |
| 2008/0081555 A1 | 4/2008 | Kong et al. | |
| 2008/0096483 A1 | 4/2008 | Van Buren et al. | |
| 2008/0212500 A1 | 9/2008 | Zhen et al. | |
| 2008/0212502 A1 | 9/2008 | Zhen et al. | |
| 2008/0267112 A1 * | 10/2008 | Lucidarme | H04B 5/02 370/315 |
| 2008/0278237 A1 | 11/2008 | Blin | |
| 2009/0086655 A1 | 4/2009 | Ghadaksaz | |
| 2009/0289739 A1 | 11/2009 | Sasaki et al. | |
| 2010/0118922 A1 | 5/2010 | Ahn | |
| 2010/0151917 A1 | 6/2010 | Wilson | |
| 2011/0070824 A1 * | 3/2011 | Braithwaite | H04B 7/2606 455/25 |
| 2011/0085477 A1 | 4/2011 | Schiff | |
| 2011/0116439 A1 * | 5/2011 | Kawasaki | H04L 5/0044 370/315 |
| 2011/0147920 A1 | 6/2011 | Choudhury et al. | |
| 2011/0151775 A1 | 6/2011 | Kang et al. | |
| 2012/0002586 A1 * | 1/2012 | Gainey | H04B 1/525 370/315 |
| 2012/0281550 A1 * | 11/2012 | Huang | H04B 1/0475 370/249 |
| 2012/0315894 A1 * | 12/2012 | Dussmann | H04B 7/15535 455/424 |
| 2012/0329523 A1 | 12/2012 | Stewart et al. | |
| 2014/0036744 A1 | 2/2014 | Zeng et al. | |
| 2014/0050212 A1 * | 2/2014 | Braz | H04J 1/08 370/343 |
| 2014/0064730 A1 * | 3/2014 | Ko | H04B 10/2575 398/67 |
| 2014/0065948 A1 | 6/2014 | Huang | |
| 2014/0169501 A1 | 6/2014 | Nazarathy et al. | |
| 2014/0266424 A1 | 9/2014 | Ashworth et al. | |
| 2015/0038097 A1 | 2/2015 | Lindoff et al. | |
| 2015/0079898 A1 | 3/2015 | Pergal | |
| 2015/0244450 A1 * | 8/2015 | Wajcer | H04B 7/15585 375/214 |
| 2015/0296515 A1 * | 10/2015 | Pehlivanoglu | H04B 1/123 370/329 |
| 2016/0006415 A1 * | 1/2016 | Takematsu | H03F 1/32 333/126 |
| 2016/0126987 A1 * | 5/2016 | Wloczysiak | H03F 1/0205 375/347 |
| 2017/0160370 A1 * | 6/2017 | Yakubisin | G01S 1/24 |

FOREIGN PATENT DOCUMENTS

| | | |
|---|---|---|
| GB | 720378 A | 12/1954 |
| GB | 952223 A | 3/1964 |
| WO | WO 2009046228 A1 | 4/2009 |

OTHER PUBLICATIONS

HMC7113LP3E; "54 dB, Logarithmic Detector / Controller, 50—8000 MHz"; Data Sheet; (2010); 12 pages.
HMC909LP4E; "RMS Power Detector Single-Ended, DC—5.8 GHz"; Data Sheet; (2010); 21 pages.
PIC16F873; "28/40-Pin 8-Bit CMOS FLASH Microcontrollers"; Data Sheet; (2001); 218 pages.
3GPP2 C.S0011-B; "Recommended Minimum Performance Standards for cdma2000® Spread Spectrum Mobile Stations"; TIA-98-E; (Dec. 13, 2002); 448 pages; Release B; Version 1, Revision E.
International search report dated May 29, 2018, in International Application No. PCT/US2018/016733, filed Feb. 2, 2018; 14 pages.
International search report dated May 29, 2018, in International Application No. PCT/US2018/016735, filed Feb. 2, 2018; 13 pages.

* cited by examiner

US 10,148,341 B2

INDEPENDENT BAND DETECTION FOR NETWORK PROTECTION

RELATED APPLICATIONS

The present application claims the benefit of U.S. Provisional Patent Application No. 62/453,904, filed Feb. 2, 2017 and the benefit of U.S. Provisional Patent Application No. 62/569,337, filed Oct. 6, 2017, the entire specifications of which are hereby incorporated by reference in their entirety for all purposes.

BACKGROUND

Signal boosters and repeaters can be used to increase the quality of wireless communication between a wireless device and a wireless communication access point, such as a cell tower. Signal boosters can improve the quality of the wireless communication by amplifying, filtering, and/or applying other processing techniques to uplink and downlink signals communicated between the wireless device and the wireless communication access point.

As an example, the signal booster can receive, via an antenna, downlink signals from the wireless communication access point. The signal booster can amplify the downlink signal and then provide an amplified downlink signal to the wireless device. In other words, the signal booster can act as a relay between the wireless device and the wireless communication access point. As a result, the wireless device can receive a stronger signal from the wireless communication access point. Similarly, uplink signals from the wireless device (e.g., telephone calls and other data) can be directed to the signal booster. The signal booster can amplify the uplink signals before communicating, via an antenna, the uplink signals to the wireless communication access point.

BRIEF DESCRIPTION OF THE DRAWINGS

Features and advantages of the disclosure will be apparent from the detailed description which follows, taken in conjunction with the accompanying drawings, which together illustrate, by way of example, features of the disclosure; and, wherein.

Figure 1:
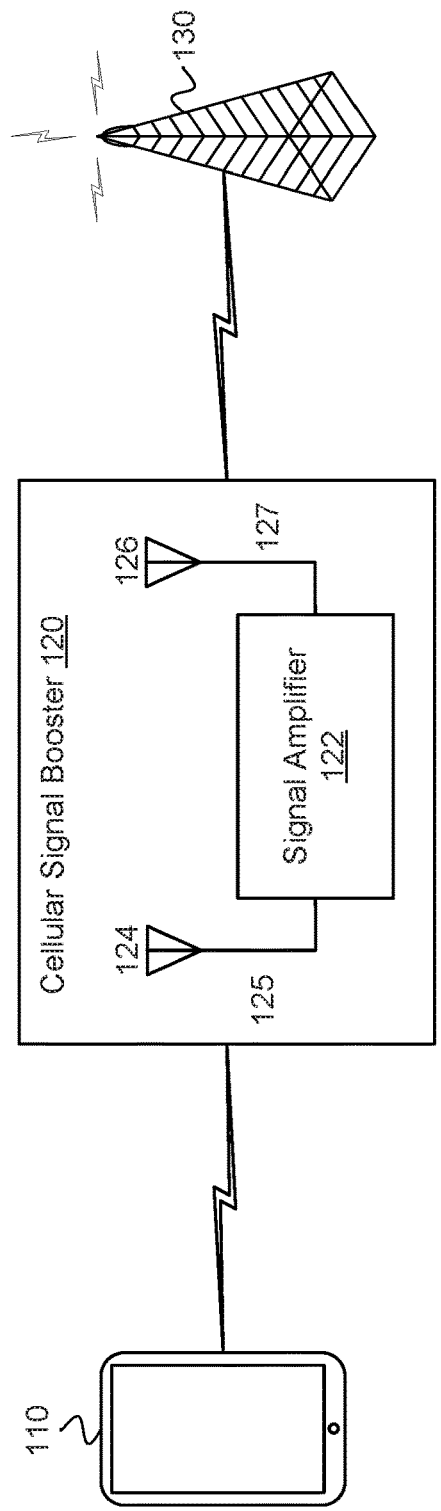
FIG. 1 illustrates a signal booster in communication with a wireless device and a base station in accordance with an example.

Reference will now be made to the exemplary embodiments illustrated, and specific language will be used herein to describe the same. It will nevertheless be understood that no limitation of the scope of the invention is thereby intended.

DETAILED DESCRIPTION

Before the present invention is disclosed and described, it is to be understood that this invention is not limited to the particular structures, process steps, or materials disclosed herein, but is extended to equivalents thereof as would be recognized by those ordinarily skilled in the relevant arts. It should also be understood that terminology employed herein is used for the purpose of describing particular examples only and is not intended to be limiting. The same reference numerals in different drawings represent the same element. Numbers provided in flow charts and processes are provided for clarity in illustrating steps and operations and do not necessarily indicate a particular order or sequence.

Example Embodiments

An initial overview of technology embodiments is provided below and then specific technology embodiments are described in further detail later. This initial summary is intended to aid readers in understanding the technology more quickly but is not intended to identify key features or essential features of the technology nor is it intended to limit the scope of the claimed subject matter.

FIG. 1 illustrates an exemplary signal booster 120 in communication with a wireless device 110 and a base station 130. The signal booster 120 can be referred to as a repeater. A repeater can be an electronic device used to amplify (or boost) signals. The signal booster 120 (also referred to as a cellular signal amplifier) can improve the quality of wireless communication by amplifying, filtering, and/or applying other processing techniques via a signal amplifier 122 to uplink signals communicated from the wireless device 110 to the base station 130 and/or downlink signals communicated from the base station 130 to the wireless device 110. In other words, the signal booster 120 can amplify or boost uplink signals and/or downlink signals bi-directionally. In one example, the signal booster 120 can be at a fixed location, such as in a home or office. Alternatively, the signal booster 120 can be attached to a mobile object, such as a vehicle or a wireless device 110.

In one configuration, the signal booster 120 can include an integrated device antenna 124 (e.g., an inside antenna or a coupling antenna) and an integrated node antenna 126 (e.g., an outside antenna). The integrated node antenna 126 can receive the downlink signal from the base station 130. The downlink signal can be provided to the signal amplifier 122 via a second coaxial cable 127 or other type of radio frequency connection operable to communicate radio frequency signals. The signal amplifier 122 can include one or more cellular signal amplifiers for amplification and filtering. The downlink signal that has been amplified and filtered can be provided to the integrated device antenna 124 via a first coaxial cable 125 or other type of radio frequency connection operable to communicate radio frequency signals. The integrated device antenna 124 can wirelessly communicate the downlink signal that has been amplified and filtered to the wireless device 110.

Similarly, the integrated device antenna 124 can receive an uplink signal from the wireless device 110. The uplink signal can be provided to the signal amplifier 122 via the first coaxial cable 125 or other type of radio frequency connection operable to communicate radio frequency signals. The signal amplifier 122 can include one or more cellular signal amplifiers for amplification and filtering. The uplink signal that has been amplified and filtered can be provided to the integrated node antenna 126 via the second coaxial cable 127 or other type of radio frequency connection operable to communicate radio frequency signals. The integrated device antenna 126 can communicate the uplink signal that has been amplified and filtered to the base station 130.

In one example, the signal booster 120 can filter the uplink and downlink signals using any suitable analog or digital filtering technology including, but not limited to, surface acoustic wave (SAW) filters, bulk acoustic wave (BAW) filters, film bulk acoustic resonator (FBAR) filters, ceramic filters, waveguide filters or low-temperature co-fired ceramic (LTCC) filters.

In one example, the signal booster 120 can send uplink signals to a node and/or receive downlink signals from the node. The node can comprise a wireless wide area network (WWAN) access point (AP), a base station (BS), an evolved Node B (eNB), a baseband unit (BBU), a remote radio head (RRH), a remote radio equipment (RRE), a relay station (RS), a radio equipment (RE), a remote radio unit (RRU), a central processing module (CPM), or another type of WWAN access point.

In one configuration, the signal booster 120 used to amplify the uplink and/or a downlink signal is a handheld booster. The handheld booster can be implemented in a sleeve of the wireless device 110. The wireless device sleeve can be attached to the wireless device 110, but can be removed as needed. In this configuration, the signal booster 120 can automatically power down or cease amplification when the wireless device 110 approaches a particular base station. In other words, the signal booster 120 can determine to stop performing signal amplification when the quality of uplink and/or downlink signals is above a defined threshold based on a location of the wireless device 110 in relation to the base station 130.

In one example, the signal booster 120 can include a battery to provide power to various components, such as the signal amplifier 122, the integrated device antenna 124 and the integrated node antenna 126. The battery can also power the wireless device 110 (e.g., phone or tablet). Alternatively, the signal booster 120 can receive power from the wireless device 110.

In one configuration, the signal booster 120 can be a Federal Communications Commission (FCC)-compatible consumer signal booster. As a non-limiting example, the signal booster 120 can be compatible with FCC Part 20 or 47 Code of Federal Regulations (C.F.R.) Part 20.21 (Mar. 21, 2013). In addition, the signal booster 120 can operate on the frequencies used for the provision of subscriber-based services under parts 22 (Cellular), 24 (Broadband PCS), 27 (AWS-1, 700 MHz Lower A-E Blocks, and 700 MHz Upper C Block), and 90 (Specialized Mobile Radio) of 47 C.F.R. The signal booster 120 can be configured to automatically self-monitor its operation to ensure compliance with applicable noise and gain limits. The signal booster 120 can either self-correct or shut down automatically if the signal booster's operations violate the regulations defined in FCC Part 20.21.

In one configuration, the signal booster 120 can improve the wireless connection between the wireless device 110 and the base station 130 (e.g., cell tower) or another type of wireless wide area network (WWAN) access point (AP). The signal booster 120 can boost signals for cellular standards, such as the Third Generation Partnership Project (3GPP) Long Term Evolution (LTE) Release 8, 9, 10, 11, 12, or 13 standards or Institute of Electronics and Electrical Engineers (IEEE) 802.16. In one configuration, the signal booster 120 can boost signals for 3GPP LTE Release 13.0.0 (March 2016) or other desired releases. The signal booster 120 can boost signals from the 3GPP Technical Specification 36.101 (Release 12 Jun. 2015) bands or LTE frequency bands. For example, the signal booster 120 can boost signals from the LTE frequency bands: 2, 4, 5, 12, 13, 17, and 25. In addition, the signal booster 120 can boost selected frequency bands based on the country or region in which the signal booster is used, including any of bands 1-70 or other bands, as disclosed in ETSI TS136 104 V13.5.0 (2016-10).

The number of LTE frequency bands and the level of signal improvement can vary based on a particular wireless device, cellular node, or location. Additional domestic and international frequencies can also be included to offer increased functionality. Selected models of the signal booster 120 can be configured to operate with selected frequency bands based on the location of use. In another example, the signal booster 120 can automatically sense from the wireless device 110 or base station 130 (or GPS, etc.) which frequencies are used, which can be a benefit for international travelers.

In one example, the integrated device antenna 124 and the integrated node antenna 126 can be comprised of a single antenna, an antenna array, or have a telescoping form-factor. In another example, the integrated device antenna 124 and the integrated node antenna 126 can be a microchip antenna. An example of a microchip antenna is AMMAL001. In yet another example, the integrated device antenna 124 and the integrated node antenna 126 can be a printed circuit board (PCB) antenna. An example of a PCB antenna is TE 2118310-1.

In one example, the integrated device antenna 124 can receive uplink (UL) signals from the wireless device 110 and transmit DL signals to the wireless device 110 using a single antenna. Alternatively, the integrated device antenna 124 can receive UL signals from the wireless device 110 using a dedicated UL antenna, and the integrated device antenna 124 can transmit DL signals to the wireless device 110 using a dedicated DL antenna.

In one example, the integrated device antenna 124 can communicate with the wireless device 110 using near field communication. Alternatively, the integrated device antenna 124 can communicate with the wireless device 110 using far field communication.

In one example, the integrated node antenna 126 can receive downlink (DL) signals from the base station 130 and transmit uplink (UL) signals to the base station 130 via a single antenna. Alternatively, the integrated node antenna 126 can receive DL signals from the base station 130 using a dedicated DL antenna, and the integrated node antenna 126 can transmit UL signals to the base station 130 using a dedicated UL antenna.

In one configuration, multiple signal boosters can be used to amplify UL and DL signals. For example, a first signal booster can be used to amplify UL signals and a second signal booster can be used to amplify DL signals. In addition, different signal boosters can be used to amplify different frequency ranges.

In one configuration, the signal booster 120 can be configured to identify when the wireless device 110 receives a relatively strong downlink signal. An example of a strong downlink signal can be a downlink signal with a signal strength greater than approximately −80 dBm. The signal booster 120 can be configured to automatically turn off selected features, such as amplification, to conserve battery life. When the signal booster 120 senses that the wireless device 110 is receiving a relatively weak downlink signal, the integrated booster can be configured to provide amplification of the downlink signal. An example of a weak downlink signal can be a downlink signal with a signal strength less than −80 dBm.

In one example, the signal booster 120 can also include one or more of: a waterproof casing, a shock absorbent casing, a flip-cover, a wallet, or extra memory storage for the wireless device. In one example, extra memory storage can be achieved with a direct connection between the signal booster 120 and the wireless device 110. In another example, Near-Field Communications (NFC), Bluetooth v4.0, Bluetooth Low Energy, Bluetooth v4.1, Bluetooth v4.2, Bluetooth 5, Ultra High Frequency (UHF), 3GPP LTE, Institute of Electronics and Electrical Engineers (IEEE) 802.11a, IEEE 802.11b, IEEE 802.11g, IEEE 802.11n, IEEE 802.11ac, or IEEE 802.11ad can be used to couple the signal booster 120 with the wireless device 110 to enable data from the wireless device 110 to be communicated to and stored in the extra memory storage that is integrated in the signal booster 120. Alternatively, a connector can be used to connect the wireless device 110 to the extra memory storage.

In one example, the signal booster 120 can include photovoltaic cells or solar panels as a technique of charging the integrated battery and/or a battery of the wireless device 110. In another example, the signal booster 120 can be configured to communicate directly with other wireless devices with signal boosters. In one example, the integrated node antenna 126 can communicate over Very High Frequency (VHF) communications directly with integrated node antennas of other signal boosters. The signal booster 120 can be configured to communicate with the wireless device 110 through a direct connection, Near-Field Communications (NFC), Bluetooth v4.0, Bluetooth Low Energy, Bluetooth v4.1, Bluetooth v4.2, Ultra High Frequency (UHF), 3GPP LTE, Institute of Electronics and Electrical Engineers (IEEE) 802.11a, IEEE 802.11b, IEEE 802.11g, IEEE 802.11n, IEEE 802.11ac, IEEE 802.11ad, a TV White Space Band (TVWS), or any other industrial, scientific and medical (ISM) radio band. Examples of such ISM bands include 2.4 GHz, 3.6 GHz, 4.9 GHz, 5 GHz, or 5.9 GHz. This configuration can allow data to pass at high rates between multiple wireless devices with signal boosters. This configuration can also allow users to send text messages, initiate phone calls, and engage in video communications between wireless devices with signal boosters. In one example, the integrated node antenna 126 can be configured to couple to the wireless device 110. In other words, communications between the integrated node antenna 126 and the wireless device 110 can bypass the integrated booster.

In another example, a separate VHF node antenna can be configured to communicate over VHF communications directly with separate VHF node antennas of other signal boosters. This configuration can allow the integrated node antenna 126 to be used for simultaneous cellular communications. The separate VHF node antenna can be configured to communicate with the wireless device 110 through a direct connection, Near-Field Communications (NFC), Bluetooth v4.0, Bluetooth Low Energy, Bluetooth v4.1, Bluetooth v4.2, Ultra High Frequency (UHF), 3GPP LTE, Institute of Electronics and Electrical Engineers (IEEE) 802.11a, IEEE 802.11b, IEEE 802.11g, IEEE 802.11n, IEEE 802.11ac, IEEE 802.11ad, a TV White Space Band (TVWS), or any other industrial, scientific and medical (ISM) radio band.

In one configuration, the signal booster 120 can be configured for satellite communication. In one example, the integrated node antenna 126 can be configured to act as a satellite communication antenna. In another example, a separate node antenna can be used for satellite communications. The signal booster 120 can extend the range of coverage of the wireless device 110 configured for satellite communication. The integrated node antenna 126 can receive downlink signals from satellite communications for the wireless device 110. The signal booster 120 can filter and amplify the downlink signals from the satellite communication. In another example, during satellite communications, the wireless device 110 can be configured to couple to the signal booster 120 via a direct connection or an ISM radio band. Examples of such ISM bands include 2.4 GHz, 3.6 GHz, 4.9 GHz, 5 GHz, or 5.9 GHz.

Figure 2A:
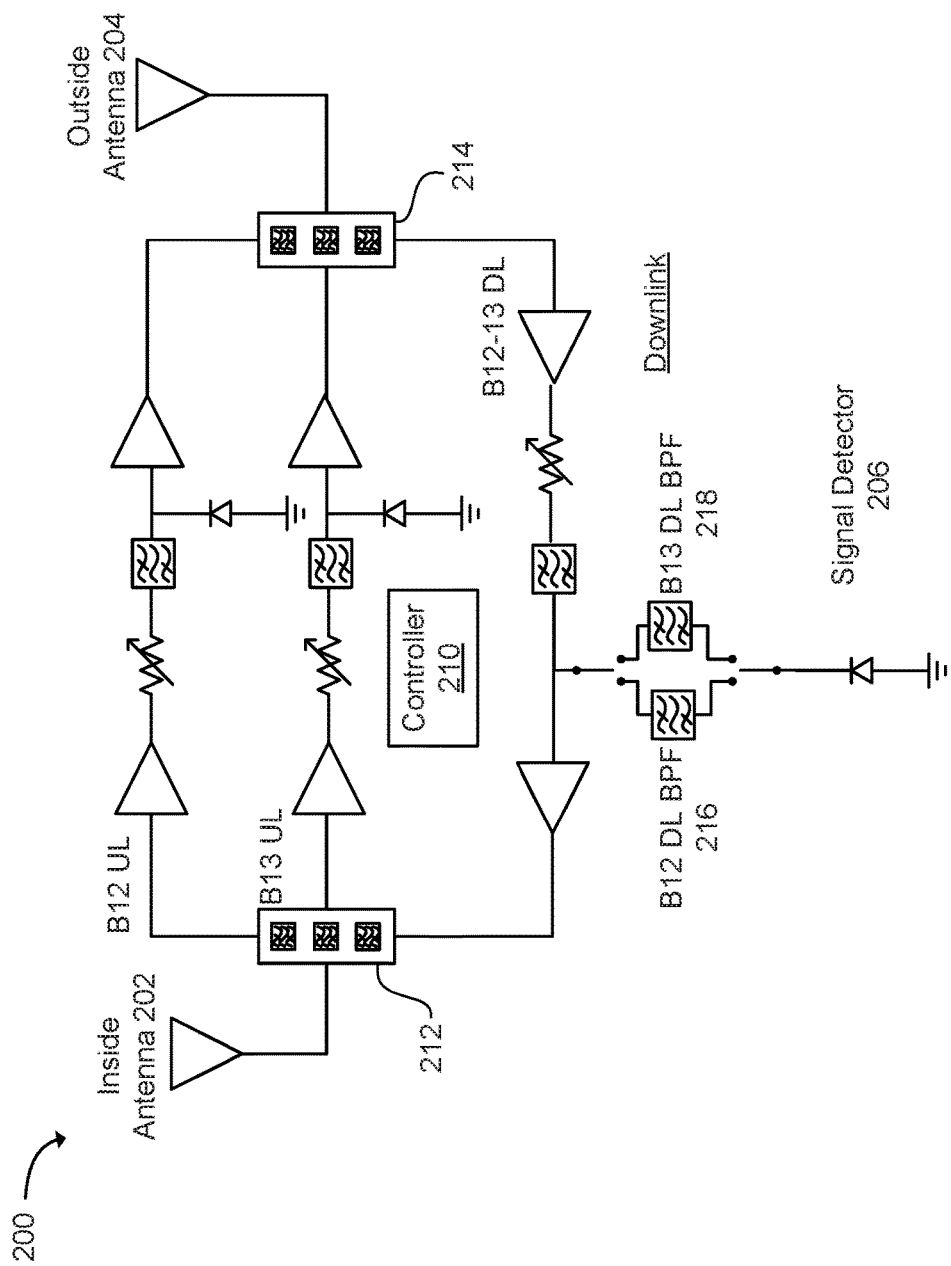
FIG. 2A illustrates a signal booster operable to independently control uplink gains or noise powers for multiple bands in uplink signal paths based on control information detected from a downlink signal path that combines multiple bands in accordance with an example.

FIG. 2A illustrates an exemplary signal booster 200. The signal booster 200 can include one or more uplink signal paths for selected bands, and the signal booster 200 can include one or more downlink signal paths for selected bands. The uplink signal paths can include one or more amplifiers and band pass filters to amplify uplink signals. Similarly, the downlink signal paths can include one or more amplifiers and band pass filters to amplify downlink signals.

In the example shown in FIG. 2A, the signal booster 200 can have a first uplink signal path for band 12 (B12) and a second uplink signal path for B13. In uplink, B12 corresponds to a frequency range of 699 megahertz (MHz) to 716 MHz, and B13 corresponds to a frequency range of 777 MHz to 787 MHz. In addition, in this example, the signal booster 200 can have a downlink signal path for both B12 and B13. In other words, the downlink signal path can be a combined downlink signal path for both B12 and B13. In downlink, B12 corresponds to a frequency range of 729 MHz to 746 MHz, and B13 corresponds to a frequency range of 746 MHz to 756 MHz. In the downlink, B12 and B13 are spectrally adjacent to each other.

In one example, the signal booster 200 can receive uplink signals from a mobile device (not shown) via an inside antenna 202 coupled to the signal booster 200. An uplink signal can pass through a first multiband filter 212, and then the uplink signal can be provided to the first uplink signal path for B12 or the second uplink signal path for B13. The first and second uplink signal paths can perform amplification and filtering of the uplink signal. The uplink signal can be provided to a second multiband filter 214, and then the uplink signal can be provided to a base station (not shown) via an outside antenna 204 coupled to the signal booster 200.

In another example, the signal booster 200 can receive downlink signals from the base station via the outside antenna 204. A downlink signal can pass through the second multiband filter 214, and then the downlink signal can be provided to the combined downlink signal path for both B12 and B13. The combined downlink signal path can perform amplification and filtering of the downlink signal. The downlink signal can be provided to the first multiband filter 212, and then the downlink signal can be provided to the mobile device via the inside antenna 202.

In one configuration, the signal booster 200 can include a controller 210. Generally speaking, the controller 210 can be configured to perform network protection for the signal booster 200. The controller 210 can perform network protection in accordance with Part 20 of the Federal Communications Commission (FCC) Consumer Booster Rules. The FCC Consumer Booster Rules necessitate that uplink signal paths and downlink signal are to work together for network protection. Network protection can be performed in order to protect a cellular network from overload or noise floor increase. The controller 210 can perform network protection by adjusting a gain or noise power for each band in the uplink transmission paths based on control information from each band in the downlink transmission paths. The control information from each band in the downlink transmission paths can include a received signal strength indication (RSSI) associated with downlink received signals. In other words, based on the RSSI of the downlink received signals traveling on the downlink transmission paths, the controller 210 can adjust (i.e., increase or decrease) the gain or noise power for the uplink transmission paths. By adjusting the gain or noise floor when performing the network protection, the signal booster 200 can prevent the network (e.g., base stations) from becoming overloaded with uplink signals from the signal booster 200 that exceed a defined threshold.

In traditional signal boosters, uplink signal paths can be separate for B12 and B13, while a combined downlink signal path can exist for B12 and B13. In other words, all the power from B12 and B13 in downlink can move through the combined downlink signal path. Since B12 and B13 are combined in the downlink, in traditional signal boosters, the network is protected based on an extra strong downlink signal since the uplink gain or noise floor is adjusted based on the combined power of downlink received signals for B12 and B13. In traditional signal boosters, the uplink gain or noise floor for B12 can be adjusted based on the combined power of downlink received signals for B12 and B13, and similarly, the uplink gain or noise floor for B13 can be adjusted based on the combined power of downlink received signals for B12 and B13. As a result, the adjustment to the uplink gain or noise floor for B12 and B13 may not actually be reflective of the power associated with the downlink received signals.

In the example shown in FIG. 2A, the controller 210 can separately detect the control information (e.g., RSSI) for downlink received signals with respect to B12 and B13. In other words, the signal booster 200 can detect control information that pertains only to downlink received signals for B12. Similarly, the signal booster 200 can detect control information that pertains only to downlink received signals for B13. The controller 210 can adjust the uplink gain or noise floor for B12 based only on the control information for the downlink received signals on B12. Similarly, the controller 210 can adjust the uplink gain or noise floor for B13 based only on the control information for the downlink received signals on B13. In other words, the uplink gain or noise power for B12 can be controlled independent of the uplink gain or noise power for B13.

More specifically, as shown in FIG. 2A, the signal booster 200 can include a switchable B12 downlink band pass filter 216, a switchable B13 downlink bandpass filter 218, and a signal detector 206. The switchable B12 downlink bandpass filter 216 and the switchable B13 downlink bandpass filter 218 can be switched in and out, such that downlink received signals for B12 can be provided to the signal detector 206 or downlink received signals for B13 can be provided to the signal detector 206. The signal detector 206 can be a log detector (e.g., a diode), and the signal detector 206 can detect the control information (e.g., RSSI) associated with the downlink received signals for B12 or the downlink received signals for B13. In other words, the switchable B12 downlink band pass filter 216 and the switchable B13 downlink bandpass filter 218 can enable the signal detector 206 to separately detect the control information for downlink received signals for B12 and B13. The signal detector 206 can provide the control information to the controller 210. Based only on the control information for downlink received signals for B12, the controller 210 can adjust the uplink gain or noise floor for B12. Similarly, based only on the control information for downlink received signals for B13, the controller 210 can adjust the uplink gain or noise floor for B13.

In general, using the signal detector 206, the controller 210 can detect single downlink bands while multiple downlink bands are passing through a common downlink signal path. With respect to the specific example shown in FIG. 2A, the controller 210 can perform independent detection of control information for B12 and B13, even though the signal booster 200 has a combined downlink signal path for B12 and B13.

In an alternative configuration, the signal booster 200 can include a first signal detector and a second signal detector. The first signal detector can detect control information (e.g., RSSI) associated with a received downlink signal for B12. The second signal detector can detect control information (e.g., RSSI) associated with a received downlink signal for B13. Therefore, in this configuration, separate signal detectors can be utilized to detect the control information for the multiple bands.

Figure 2B:
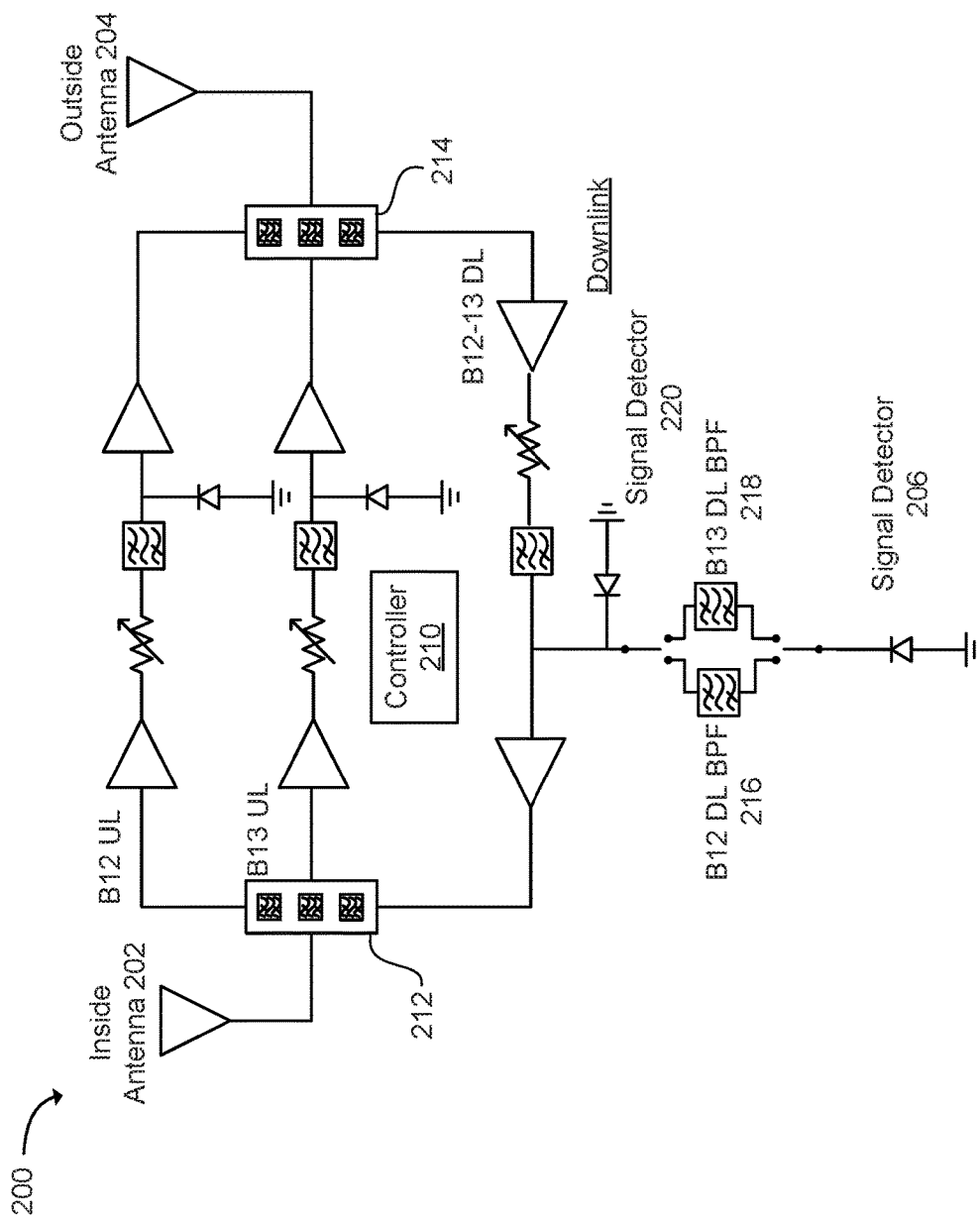
FIG. 2B illustrates a signal booster in accordance with an example.

FIG. 2B illustrates an exemplary signal booster 200. The signal booster 200 can include one or more uplink signal paths for selected bands, and the signal booster 200 can include one or more downlink signal paths for selected bands. The uplink signal paths can include one or more amplifiers and band pass filters to amplify uplink signals. Similarly, the downlink signal paths can include one or more amplifiers and band pass filters to amplify downlink signals. In addition, the signal booster 200 can include a controller 210 that is configured to perform network protection for the signal booster 200.

In one configuration, a downlink signal path can include a signal detector 220. The signal detector 220 can be positioned after an amplifier in the downlink signal path, but prior to switchable B12 or B13 downlink band pass filters 216, 218 in the downlink signal path. The signal detector 220 can measure a power level of a downlink signal that is traveling on the downlink signal path. The power level of the signal can be utilized to perform automatic gain control (AGC) and to maintain linearity for downlink signals.

In one configuration, the signal booster 200 can include a downlink signal path that directs a downlink signal in a first band to a switchable bandpass filter associated with a second band when a power level of the downlink signal is greater than a defined threshold. The switchable bandpass filter can cause a reduction in the power level of the downlink signal, which can avoid a performance of automatic gain control (AGC) for the first band. As an example, the signal booster 200 can include a downlink signal path that directs a downlink signal in B12 to a switchable bandpass filter 218 associated with B13 when a power level associated with the downlink signal in B12 is greater than the defined threshold. The switchable bandpass filter 218 associated with B13 can reduce the power level of the downlink signal, and as a result, the signal booster 200 may not perform AGC for B12.

Figure 2C:
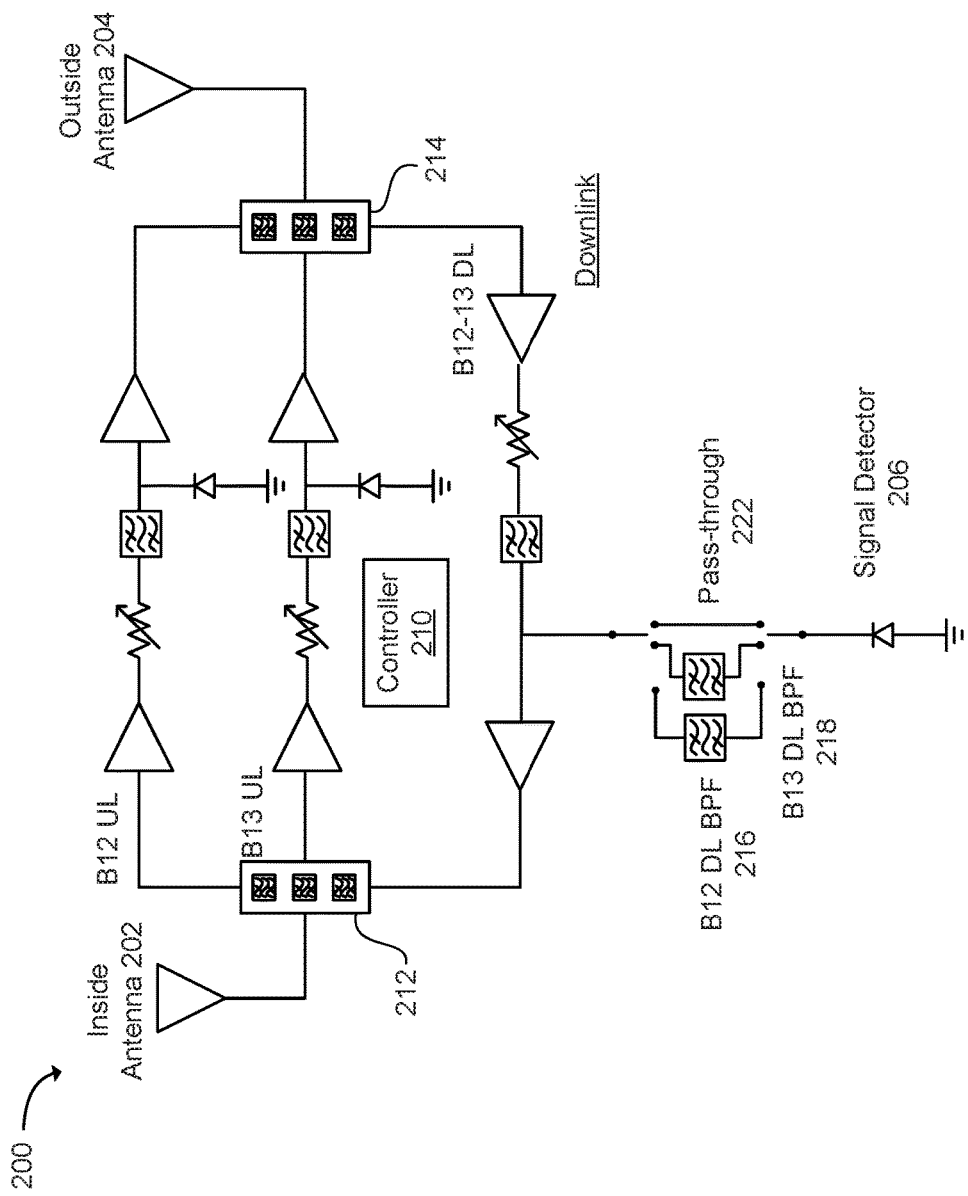
FIG. 2C illustrates a signal booster in accordance with an example.

FIG. 2C illustrates an exemplary signal booster 200. The signal booster 200 can include one or more uplink signal paths for selected bands, and the signal booster 200 can include one or more downlink signal paths for selected bands. The uplink signal paths can include one or more amplifiers and band pass filters to amplify uplink signals. Similarly, the downlink signal paths can include one or more amplifiers and band pass filters to amplify downlink signals. In addition, the signal booster 200 can include a controller 210 that is configured to perform network protection for the signal booster 200.

In one configuration, a downlink signal path can include a signal detector 206. More specifically, the downlink signal path can include a pass through signal path 222 to the signal detector 206. The pass through signal path 222 can bypass switchable B12 and B13 downlink band pass filters 216, 218 in the downlink signal path. The signal detector 206 can measure a signal power level for the pass through signal path 222. The signal power level can be utilized to perform automatic gain control (AGC) and to maintain linearity for downlink signals.

In one example, a downlink signal for B12 can be directed to the signal detector 206 via the switchable B12 bandpass filter 216. The signal detector 206 can measure a power level of the downlink signal for B12. Depending on the power level in relation to a defined threshold, the controller 210 can perform network protection for an uplink signal path for B12. In another example, a downlink signal for B13 can be directed to the signal detector 206 via the switchable B13 bandpass filter 218. The signal detector 206 can measure a power level of the downlink signal for B13. Depending on the power level in relation to a defined threshold, the controller 210 can perform network protection for an uplink signal path for B13. In some cases, the downlink signal for B12 or B13 may not be directed to the switchable B12 bandpass filter 216 or the switchable B13 bandpass filter 218. Rather, the downlink signal can be provided directly to the signal detector 206 via the pass through signal path 222.

In one configuration, a signal booster (or repeater) can employ a single-input single-output (SISO) and/or double-input single-output (DISO) filtering architecture, which can allow multiple bands to share a same radio frequency (RF) path (e.g., B12 and B13 can share a same uplink path, or B12 and B13 can share a same downlink path), thereby reducing the number of components and the cost of the signal booster. However, when multiple bands share the same RF path, the performance of the signal booster can degrade. This reduction in performance can occur because every band sharing the same RF path is automatic gain controlled at a lowest automatic gain control (AGC) value between the multiple bands. In other words, the multiple bands on the same RF path can all use a lowest AGC value between the multiple bands. A band that is automatic gain controlled before its actual or true AGC value is reached can output less power as compared to a maximum potential for that band.

In one configuration, varying architectures can be employed in signal boosters to enable band/frequency-specific detection from a shared signal chain. In a first architecture, a diplexer can be used to separate bands in the signal booster. For example, a diplexer can be used to separate band 5 (B5) from B12 and B13. The diplexer can be positioned before a detector in the signal booster. In this architecture, a detector sensitivity can be adjusted for B5 separately from B12 and B13. In this example, B12 and B13 can be automatic gain controlled at different values as compared to an AGC value for B5. This architecture can be employed for any combination of bands sharing the same RF path, with correct filtering before the detector, and variations of pickup resistor values in series with those filters. In a second architecture, an RF switch can be employed in the signal booster. The RF switch can allow switching between RF paths containing bandpass filters for each band sharing the RF path.

In a third architecture, as described in further detail below, rather than using an RF switch, the signal booster can include multiple tap points off of the signal chain, which can enable band/frequency-specific detection from the signal chain. This architecture is not limited to the SISO architecture implementation, and can be applicable to any signal chain that passes multiple frequencies. The elimination of the RF switch in the third architecture can decrease complexity and cost of the signal booster.

Figure 3:
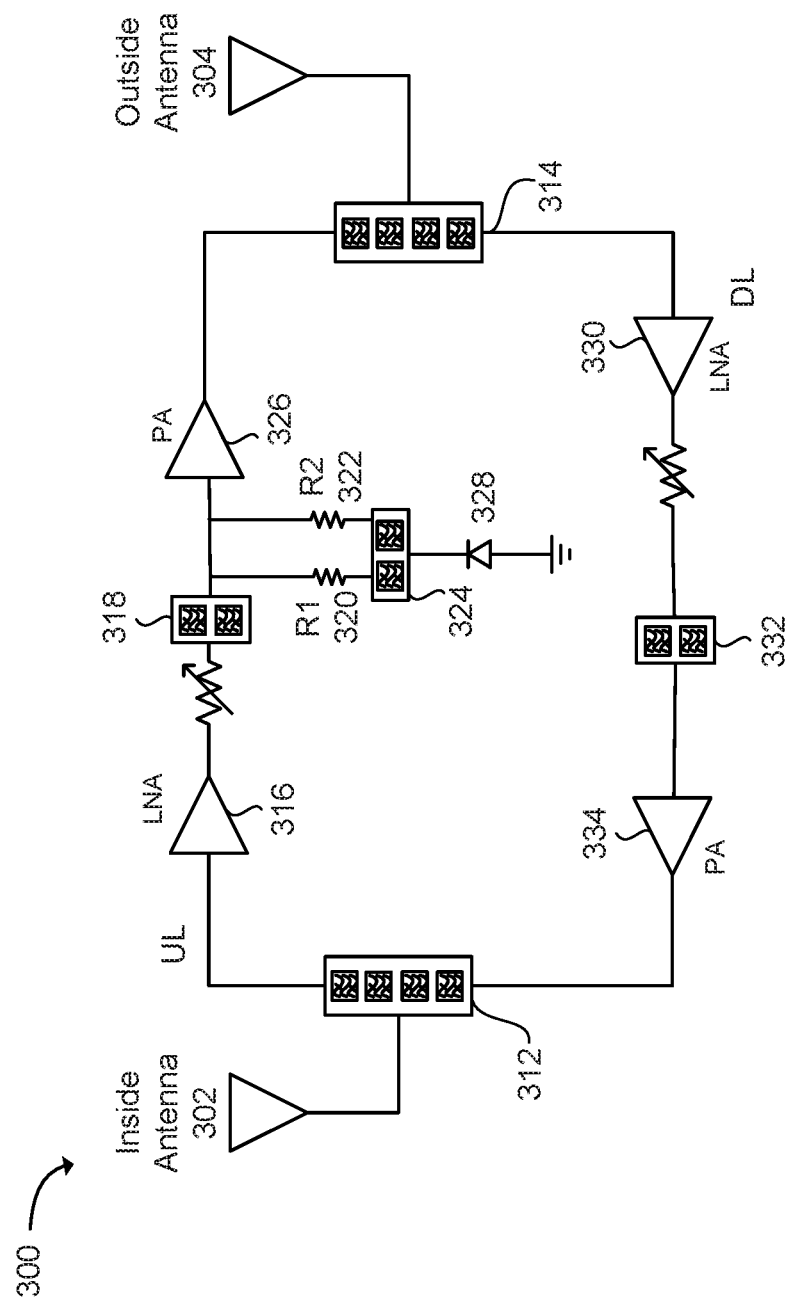
FIGS. 3 to 5 illustrate a signal booster in accordance with an example.

FIG. 3 illustrates an exemplary signal booster 300 (or repeater). The signal booster 300 can include a first multiband filter 312 and a second multiband filter 314. The first multiband filter 312 can be communicatively coupled to an inside antenna 302, and the second multiband filter 314 can be communicatively coupled to an outside antenna 304. The signal booster 300 can include an uplink (UL) signal path communicatively coupled between the first multiband filter 312 and the second multiband filter 314. The signal booster 300 can include a downlink (DL) signal path communicatively coupled between the first multiband filter 312 and the second multiband filter 314. The UL signal path can include one or more amplifiers and filters. For example, the UL signal path can include a low noise amplifier (LNA), 316 a filter 318 (e.g., a SISO filter) and a power amplifier (PA) 326. Similarly, the DL signal path can include one or more amplifiers and filters. For example, the DL signal path can include a LNA 330, a filter 332 (e.g., a SISO filter) and a PA 334.

In one example, the UL signal path and/or the DL signal path can be communicatively coupled to multiple tap paths. For example, as shown, the UL signal path can be communicatively coupled to a first tap path and a second tap path. The first tap path can include a first resistor (R1) 320 and the second tap path can include a second resistor (R2) 322. The first tap path and the second tap path can be communicatively coupled to a filter 324 (e.g., a DISO filter), and the filter 324 can be communicatively coupled to a signal detector 328. In one example, the DL signal path can be communicatively coupled to a separate first tap path, a separate second tap path, a separate filter and a separate signal detector, similar to the UL signal path.

In one example, an uplink signal can be received at the inside antenna 302. The uplink signal can travel to the first multiband filter 312, and the uplink signal can be directed to the uplink signal path. The uplink signal can pass through the LNA 316 and the filter 318. Then, the uplink signal can be provided to the first tap path and the second tap path, and then through the filter 324. At this point, a power level of the uplink signal passing through the filter 324 can be detected at the signal detector 328.

In some cases, signals in one band of the uplink signal path can enter the signal detector 328 at a different level (e.g., a higher or lower power level) as compared to another band of the uplink signal path. For example, signals in B12 can enter the signal detector 328 at a higher decibel (dB) level as compared to signals in B13 that enter the signal detector 328, or vice versa.

Therefore, as shown in FIG. 3, the first tap path and the second tap path can function to level out detected power level differences (or detection variances) between the different bands in the UL signal path. For example, a value of R1 320 and a value of R2 322 can be physically adjusted, such that if one band is stronger than the other band, the value of R1 320 and the value of R2 322 can be adjusted to balance out the power levels between the two bands in the UL signal path. As an example, if signals in B12 are stronger (i.e., have a higher dB value) as compared to signals in B13, the value of R1 320 and the value of R2 322 can be adjusted higher or lower, respectively. The signals can pass through the filter 324, which can include a B12 filter and a B13 filter. As a result, both B12 and B13 can use a same AGC value. In other words, the value of R1 320 and the value of R2 322 can be adjusted such that both B12 and B13 react to a same AGC value, even when signals in B12 are received at a higher power level as compared to signals in B13, or vice versa.

In the example shown in FIG. 3, the signal booster 300 may be unable to perform band/frequency-specific detection. For example, the signal booster 300 may be unable to distinguish signals in B12 from signals in B13. However, the value of R1 320 and the value of R2 322 can be adjusted such that both B12 and B13 react to a same AGC value, even when signals in B12 are received at a higher power level as compared to signals in B13, or vice versa.

Generally speaking, signal boosters can utilize an AGC value or threshold. When an input signal exceeds the AGC value or threshold, the signal booster can perform AGC, shut off, perform an oscillation detection, etc. In one example, signal boosters that employ a SISO architecture can sometimes have signals in one band that are received with a higher power level (e.g., one or two or three dB higher) as compared to signals that are received in another band. This difference in power levels can be significant to the signal booster, especially with respect to uplink output power. It is desirable to maximize the uplink output power, and a maximum uplink output power may not be achieved when there is a detection variance or imbalance between different bands in signal path(s) of the signal booster.

Therefore, as shown in FIG. 3, it is advantageous to include the first and second tap paths (with the first and second resistance values, respectively) to level out detection variances between different bands in the signal path(s) of the signal booster 300.

In one example, the signal booster 300 can employ uplink AGC and/or downlink AGC. For example, the signal booster 300 can employ the first tap path and the second tap path in the UL signal path to detect a power level of an uplink signal, and the signal booster 300 can perform the uplink AGC based on a detected power level of the uplink signal. The signal booster 300 can perform the uplink AGC to maintain a linearity of the UL signal path and/or to maximize an uplink output power. In another example, the signal booster 300 can employ a first tap path and a second tap path in the DL signal path to detect a power level of a downlink signal, and the signal booster 300 can perform the uplink AGC based on a detected power level of the downlink signal. The signal booster 300 can perform the uplink AGC for network protection received signal strength indication (RSSI) levels. In other words, if a power level of the downlink signal exceeds a threshold, the signal booster 300 can perform the uplink AGC to adjust (e.g., increase or decrease) a gain of the uplink signal path to protect the network.

Figure 4:
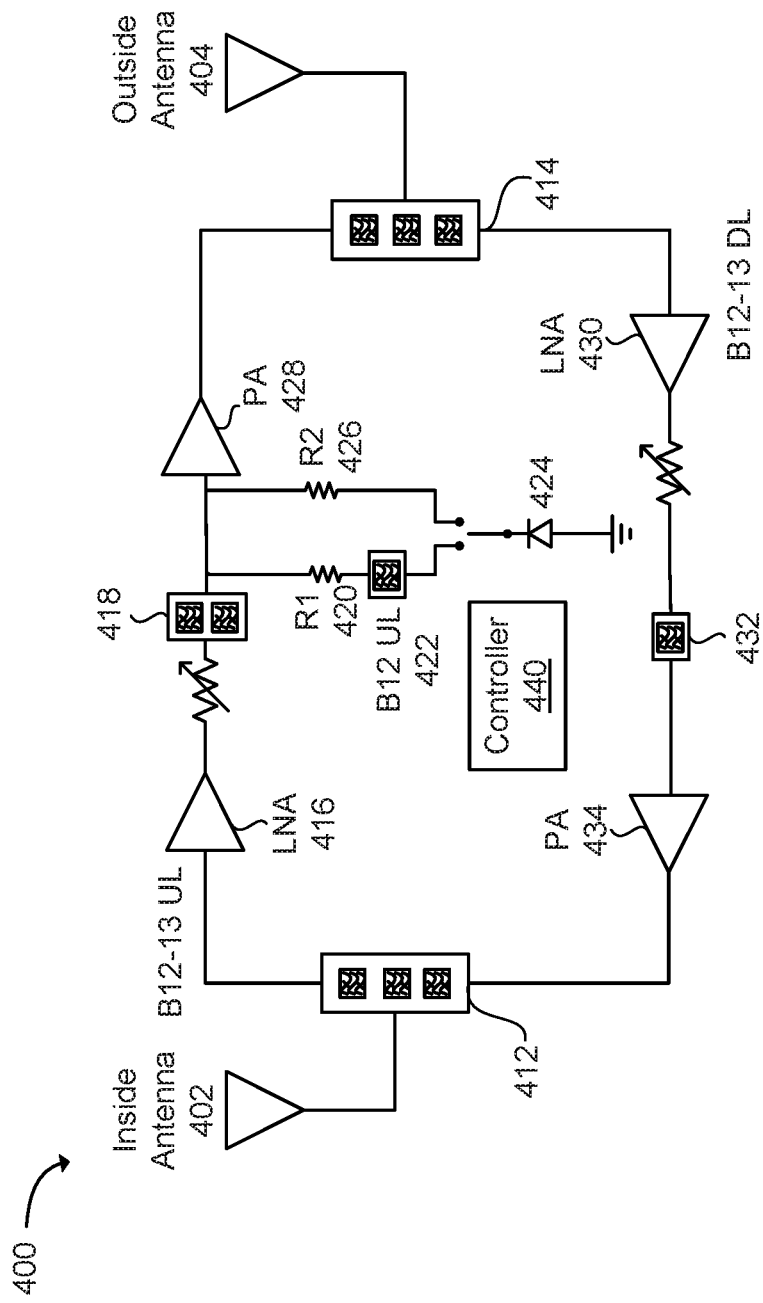

FIG. 4 illustrates an exemplary signal booster 400 (or repeater). The signal booster 400 can include a first multiband filter 412 and a second multiband filter 414. The first multiband filter 412 can be communicatively coupled to an inside antenna 402, and the second multiband filter 414 can be communicatively coupled to an outside antenna 404. The signal booster 400 can include an uplink (UL) signal path communicatively coupled between the first multiband filter 412 and the second multiband filter 414. For example, the UL signal path can be a B12-13 UL signal path. The signal booster 400 can include a downlink (DL) signal path communicatively coupled between the first multiband filter 412 and the second multiband filter 414. For example, the DL signal path can be a B12-13 DL signal path. The UL signal path can include one or more amplifiers and filters, such as a low noise amplifier (LNA) 416, a filter 418 (e.g., a SISO filter) and a power amplifier (PA) 428. Similarly, the DL signal path can include one or more amplifiers and filters, such as an LNA 430, a filter 432 (e.g., a SISO filter) and a PA 434.

In one example, the UL signal path and/or the DL signal path can be communicatively coupled to multiple tap paths. For example, as shown, the UL signal path can be communicatively coupled to a first tap path and a second tap path. The first tap path can include a first resistor (R1) 420 and the second tap path can include a second resistor (R2) 426. The first tap path can include a filter 422 (e.g., a SISO filter). For example, the filter 422 can be a B12 UL filter. In this example, the first tap path can be a filtered path and the second tap path can be an unfiltered path. The first tap path and the second tap path can be switchably connected to a signal detector 424. In other words, the signal detector 424 can be connected to either the first tap path or the second tap path via a switch. In one example, the DL signal path can be communicatively coupled to a separate first tap path, a separate second tap path, and a separate signal detector, similar to the UL signal path.

In one example, an uplink signal can be received at the inside antenna 402. The uplink signal can travel to the first multiband filter 412, and the uplink signal can be directed to the uplink signal path (e.g., the B12-13 UL signal path). The uplink signal can pass through the LNA 416 and the filter 418. Then, the uplink signal can be provided to the first tap path and the second tap path. Depending on a position of the switch, an uplink signal traveling on the first tap path or an uplink signal traveling on the second tap path can be provided to the signal detector 424. The signal detector 424 can detect a power level of the received uplink signal.

In one example, the UL signal path can be a B12-13 UL signal path, and the first tap path and the second tap path can function to achieve a leveling of detection variances between the two bands, as well as band-specific detection (i.e., an ability to distinguish signals in B12 as opposed to signals in B13). In one example, a value of R1 420 and a value of R2 426 can be physically adjusted (or digitally changed to maximize flexibility), such that if B12 is stronger than B13, or vice versa, the value of R1 420 and the value of R2 422 can be adjusted to balance out detected power levels between B12 and B13 in the UL signal path. In addition, when the switch is on the first tap path (i.e., the filtered path), a B12 uplink signal can pass through the filter 422 (i.e., the B12 UL filter), and a power level of the B12 uplink signal can be detected at the signal detector 424. When the switch is on the second tap path (i.e., the unfiltered path), a B12 uplink signal can be directed through the second tap path, and a power level of the B12 uplink signal can be detected at the signal detector 424. On the other hand, when the switch is on the first tap path (i.e., the filtered path), a B13 uplink signal can be filtered by the filter 422 (i.e., the B12 UL filter), and no or a minimal signal can be detected at the signal detector 424. When the switch is on the second tap path (i.e., the unfiltered path), a B13 uplink signal can be directed through the second tap path, and a power level of the B13 uplink signal can be detected at the signal detector 424. Therefore, depending on whether the switch is on the first tap path or the second tap path and whether the uplink signal is a B12 uplink signal or a B13 uplink signal, the signal detector 424 can perform band-specific detection. In other words, the signal detector 424 can distinguish between signals in B12 versus signals in B13. In addition, since separate band detection is achieved using the first tap path and the second tap path, the signal booster 300 can set two different AGC values or thresholds. For example, the signal booster 300 can set a first AGC value or threshold for B12, and the signal booster 300 can set a second AGC value or threshold for B13.

In one configuration, the signal booster 400 can utilize one or more duplexers, diplexers, multiplexers, SISO filters and/or DISO filters to enable band-specific detection. The signal booster 400 can utilize the first tap path and the second tap path (and the respective resistors and filter(s) to enable increased performance for SISO or shared frequency/band signal chains.

In one configuration, the first tap path and the second tap path can utilize resistors. Alternatively, the first tap path and the second tap path can utilize couplers, capacitors, or other signal tapping techniques. In other words, in addition to using resistors as taps for a detector signal path, capacitors or couplers can be utilized as an alternative.

In one configuration, the signal booster 400 can include a signal path (e.g., an UL signal path or a DL signal path) that direct signals in two or more spectrally adjacent or non-spectrally adjacent bands (e.g., B12 and B13). The signal booster 400 can include a first impedance in a first tap path (e.g., a filtered path that includes a bandpass filter) with a first impedance value or a first coupling factor selected to provide a first selected voltage at the signal detector 424 to set a first AGC level for B12. Similarly, the signal booster 400 can include a second impedance in a second tap path (e.g., an unfiltered path) with a second impedance value or a second coupling factor selected to provide a second selected voltage at the signal detector 424 to set a second AGC level for B13. The signal detector 424 can be switchably connected to the first tap path and the second tap path to enable separate band detection for B12 and B13, respectively. In addition, the first impedance value or the first coupling factor and the second impedance value or the second coupling factor can be adjusted to level a detection variance with respect to detected power levels between signals received in B12 as compared to B13 in the signal path.

In one configuration, the signal booster 400 can include a controller 440. The controller 440 can adjust a gain for a defined band (e.g., B12 or B13) of the signal path for network protection depending on an input or output signal level. In addition, the controller 440 can adjust a gain for a defined band (e.g., B12 or B13) of the signal path to maintain linearity for the signal path depending on an input or output signal level.

Figure 5:
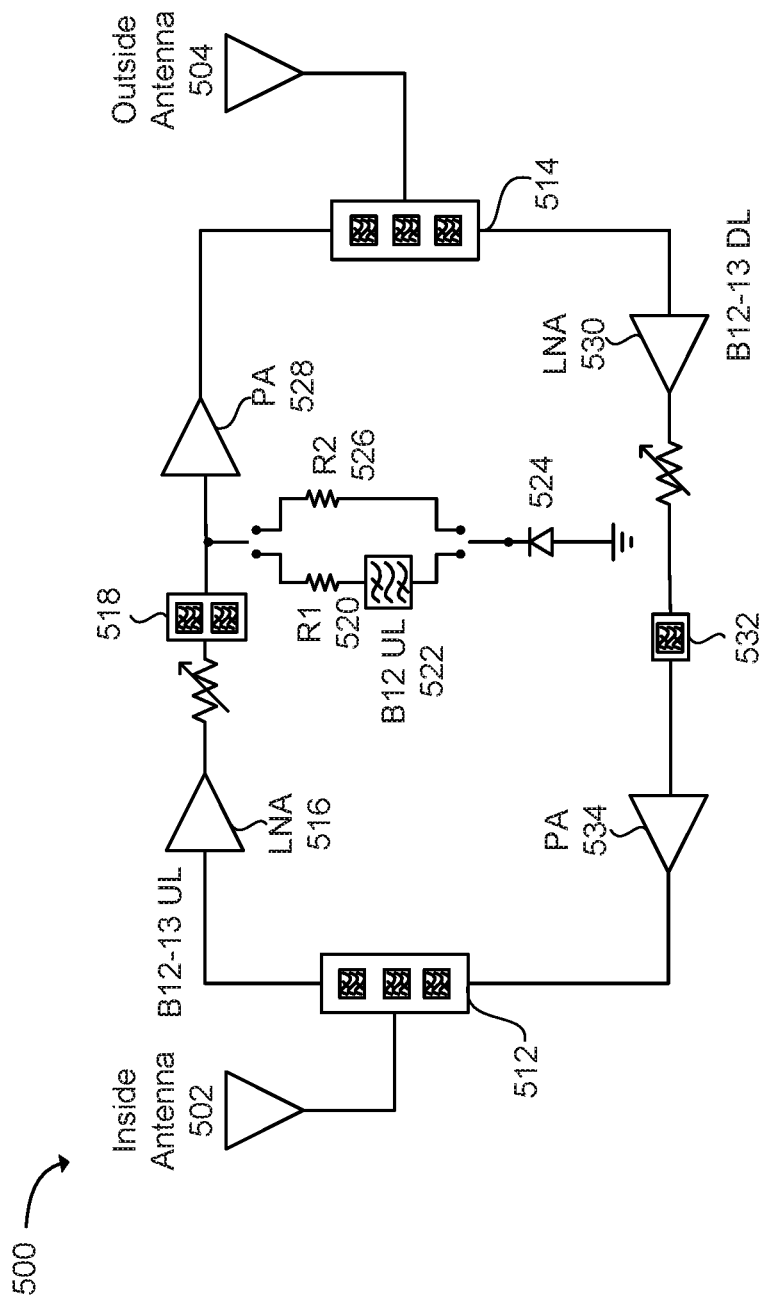

FIG. 5 illustrates an exemplary signal booster 500 (or repeater). The signal booster 500 can include a first multiband filter 512 and a second multiband filter 514. The first multiband filter 512 can be communicatively coupled to an inside antenna 502, and the second multiband filter 514 can be communicatively coupled to an outside antenna 504. The signal booster 500 can include an uplink (UL) signal path communicatively coupled between the first multiband filter 512 and the second multiband filter 514. For example, the UL signal path can be a B12-13 UL signal path. The signal booster 500 can include a downlink (DL) signal path communicatively coupled between the first multiband filter 512 and the second multiband filter 514. For example, the DL signal path can be a B12-13 DL signal path. The UL signal path can include one or more amplifiers and filters, such as a low noise amplifier (LNA) 516, a filter 518 (e.g., a SISO filter) and a power amplifier (PA) 528. Similarly, the DL signal path can include one or more amplifiers and filters, such as an LNA 530, a filter 532 (e.g., a SISO filter) and a PA 534.

In one example, the UL signal path and/or the DL signal path can be communicatively coupled to multiple tap paths. For example, as shown, the UL signal path can be switchably connected to a first tap path and a second tap path. The first tap path can include a first resistor (R1) 520 and the second tap path can include a second resistor (R2) 526. The first tap path can include a filter 522 (e.g., a SISO filter). For example, the filter 522 can be a B12 UL filter. In this example, the first tap path can be a filtered path and the second tap path can be an unfiltered path. The first tap path and the second tap path can be switchably connected to a signal detector 524. In other words, the signal detector 524 can be connected to either the first tap path or the second tap path via a switch. In one example, the DL signal path can be switchably connected to a separate first tap path, a separate second tap path, and a separate signal detector (which is switchably connected to the separate first tap path and the separate second tap path), similar to the UL signal path.

Figure 6:
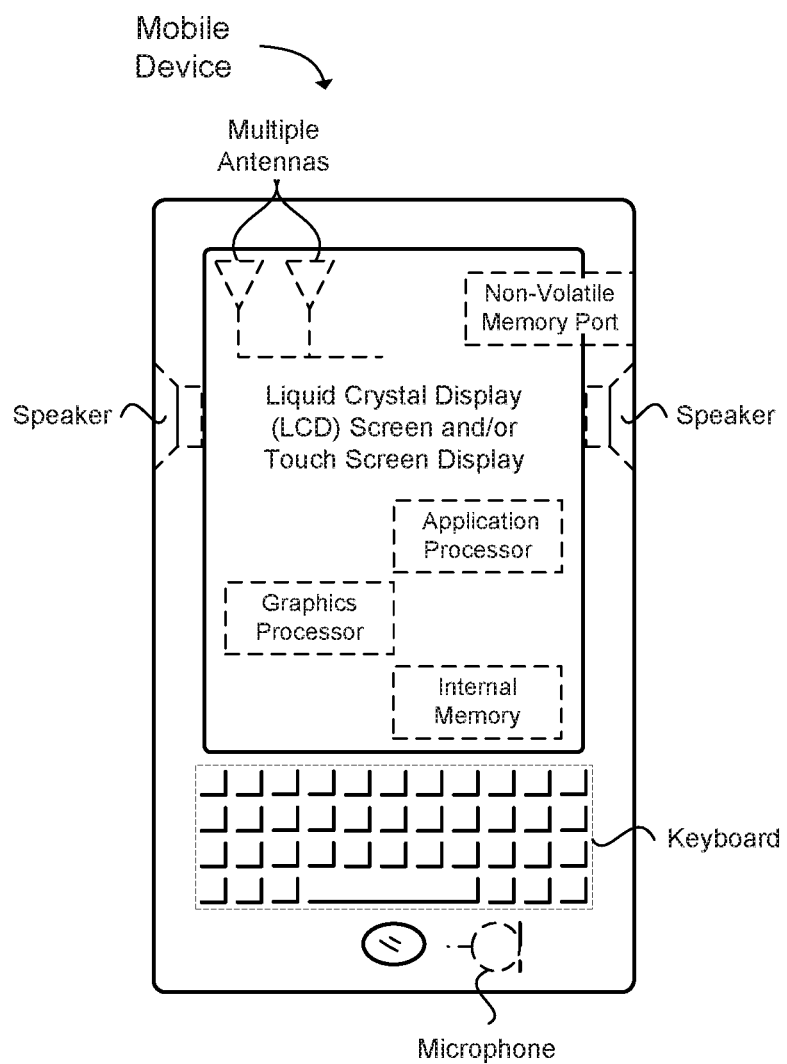
FIG. 6 illustrates a wireless device in accordance with an example.

FIG. 6 provides an example illustration of the wireless device, such as a user equipment (UE), a mobile station (MS), a mobile communication device, a tablet, a handset, a wireless transceiver coupled to a processor, or other type of wireless device. The wireless device can include one or more antennas configured to communicate with a node or transmission station, such as an access point (AP), a base station (BS), an evolved Node B (eNB), a baseband unit (BBU), a remote radio head (RRH), a remote radio equipment (RRE), a relay station (RS), a radio equipment (RE), a remote radio unit (RRU), a central processing module (CPM), or other type of wireless wide area network (WWAN) access point. The wireless device can communicate using separate antennas for each wireless communication standard or shared antennas for multiple wireless communication standards. The wireless device can communicate in a wireless local area network (WLAN), a wireless personal area network (WPAN), and/or a WWAN.

FIG. 6 also provides an illustration of a microphone and one or more speakers that can be used for audio input and output from the wireless device. The display screen can be a liquid crystal display (LCD) screen, or other type of display screen such as an organic light emitting diode (OLED) display. The display screen can be configured as a touch screen. The touch screen can use capacitive, resistive, or another type of touch screen technology. An application processor and a graphics processor can be coupled to internal memory to provide processing and display capabilities. A non-volatile memory port can also be used to provide data input/output options to a user. The non-volatile memory port can also be used to expand the memory capabilities of the wireless device. A keyboard can be with the wireless device or wirelessly connected to the wireless device to provide additional user input. A virtual keyboard can also be provided using the touch screen.

Examples

The following examples pertain to specific technology embodiments and point out specific features, elements, or actions that can be used or otherwise combined in achieving such embodiments.

Example 1 includes a signal booster, comprising: a first signal path that includes one or more amplifiers and one or more band pass filters, wherein the first signal path is configured to amplify and filter first signals in one or more selected bands; a second signal path that includes one or more amplifiers and one or more band pass filters, wherein the second signal path is configured to amplify and filter received second signals in a plurality of selected bands, wherein the second signal path combines at least a first band and a second band in the plurality of selected bands; and a controller operable to perform network protection by adjusting a gain or noise power for at least one of a first band or a second band in the first signal path, wherein the gain or noise power is adjusted for the first band in the first signal path using control information associated with a received signal in the first band of the second signal path, wherein the gain or noise power is adjusted for the second band in the first signal path using control information associated with a received signal in the second band of the second signal path.

Example 2 includes the signal booster of Example 1, wherein the control information associated with the received signal in the first band of the second signal path and the control information associated with the received signal in the second band of the second signal path includes a received signal strength indication (RSSI).

Example 3 includes the signal booster of any of Examples 1 to 2, further comprising a signal detector operable to: detect the control information associated with the received signal in the first band of the second signal path; and detect the control information associated with the received signal in the second band of the second signal path, wherein the signal booster is configured to switch two or more bandpass filters (BPFs) in and out to enable the signal detector to detect control information associated with different received signals in different bands.

Example 4 includes the signal booster of any of Examples 1 to 3, wherein the two or more BPFs are switched in and out in the first signal path or the second signal path in order to detect the control information.

Example 5 includes the signal booster of any of Examples 1 to 4, further comprising: a first signal detector operable to detect the control information associated with the received signal in the first band of the second signal path; and a second signal detector operable to detect the control information associated with the received signal in the second band of the second signal path.

Example 6 includes the signal booster of any of Examples 1 to 5, wherein the uplink gain or noise power for the first band in the uplink signal path is controlled independent of the uplink gain or noise power for the second band in the uplink signal path.

Example 7 includes the signal booster of any of Examples 1 to 6, wherein: the first band of the uplink signal path and the first band of the downlink signal path is band 12 (B12); and the second band of the uplink signal path and the second band of the downlink signal path is band 13 (B13).

Example 8 includes the signal booster of any of Examples 1 to 7, wherein the second signal path is configured to direct a signal in the first band to a bandpass filter associated with the second band when a power level of the signal is greater than a defined threshold, wherein the bandpass filter associated with the second band causes a reduction in the power level of the signal to avoid performing automatic gain control (AGC) for the first band.

Example 9 includes the signal booster of any of Examples 1 to 8, wherein: the second signal path is configured to direct a signal in the first band to a signal detector via a bandpass filter associated with the first band, wherein a power level of the signal in relation to a defined threshold causes the controller to perform network protection for the first band in the first signal path; or the second signal path is configured to direct the signal in the second band to the signal detector via a bandpass filter associated with the second band, wherein a power level of the signal in relation to a defined threshold causes the controller to perform network protection for the second band in the second signal path.

Example 10 includes the signal booster of any of Examples 1 to 9, wherein the signal booster is a cellular signal booster configured to amplify cellular signals and retransmit amplified cellular signals.

Example 11 includes the signal booster of any of Examples 1 to 10, further comprising: an inside antenna to receive uplink signals from a mobile device; and an outside antenna to transmit amplified and filtered uplink signals to a base station.

Example 12 includes the signal booster of any of Examples 1 to 11, further comprising: an outside antenna to receive downlink signals from a base station; and an inside antenna to transmit amplified and filtered downlink signals to a mobile device.

Example 13 includes a cellular signal booster operable to amplify cellular signals, comprising: a downlink cellular signal path configured to amplify and filter a received downlink cellular signal in a plurality of selected bands, wherein the downlink signal path combines at least a first band and a second band in the plurality of selected bands; and a controller operable to perform network protection by adjusting an uplink gain or noise power for at least one of a first band or a second band in an uplink signal path, wherein the uplink gain or noise power is adjusted for the first band in the uplink signal path or the second band in the uplink signal path using a signal strength associated with the received downlink cellular signal on the downlink cellular signal path.

Example 14 includes the cellular signal booster of Example 13, further comprising a cellular signal detector operable to: detect the signal strength associated with the received downlink cellular signal in the first band of the downlink signal path; and detect the signal strength associated with the received downlink cellular signal in the second band of the downlink signal path, wherein the cellular signal booster is configured to switch two or more bandpass filters (BPFs) in and out to enable the cellular signal detector to detect control information associated with different received downlink cellular signals in different bands.

Example 15 includes the cellular signal booster of any of Examples 13 to 14, further comprising: a first cellular signal detector operable to detect the signal strength associated with the received downlink cellular signal in the first band of the downlink signal path; and a second cellular signal detector operable to detect the signal strength associated with the received downlink cellular signal in the second band of the downlink signal path.

Example 16 includes the cellular signal booster of any of Examples 13 to 15, wherein: the first band of the uplink signal path and the first band of the downlink signal path is band 12 (B12); and the second band of the uplink signal path and the second band of the downlink signal path is band 13 (B13).

Example 17 includes a system operable to transmit amplified signals, the system comprising: an uplink signal path configured to amplify and filter uplink signals in one or more selected bands; a downlink signal path configured to amplify and filter received downlink signals in two or more selected bands, wherein the downlink signal path combines a first band and a second band; and a controller operable to perform network protection by adjusting an uplink gain or noise power for at least one of a first band in the uplink signal path or a second band in the uplink signal path, wherein the uplink gain or noise power is adjusted for the first band in the uplink signal path using control information associated with a received downlink signal in the first band of the downlink signal path, wherein the uplink gain or noise power is adjusted for the second band in the uplink signal path using control information associated with a received downlink signal in the second band of the downlink signal path.

Example 18 includes the system of Example 17, wherein the control information associated with the received downlink signal in the first band of the downlink signal path and the control information associated with the received downlink signal in the second band of the downlink signal path includes a received signal strength indication (RSSI).

Example 19 includes the system of any of Examples 17 to 18, wherein the uplink gain or noise power for the first band in the uplink signal path is controlled independent of the uplink gain or noise power for the second band in the uplink signal path.

Example 20 includes the system of any of Examples 17 to 19, further comprising: an outside antenna configured to receive downlink signals from a base station and transmit amplified and filtered uplink signals to the base station; and an inside antenna configured to receive uplink signals from a mobile device and transmit amplified and filtered downlink signals to the mobile device.

Example 21 includes the system of any of Examples 17 to 20, wherein: the first band of the uplink signal path and the first band of the downlink signal path is band 12 (B12); and the second band of the uplink signal path and the second band of the downlink signal path is band 13 (B13).

Example 22 includes a repeater, comprising: a signal path operable to direct signals in two or more bands comprising at least: a first band and a second band in the signal path; a first tap path communicatively coupled to the signal path; a second tap path communicatively coupled to the signal path; a signal detector connected to the first tap path and the second tap path; a first impedance in the first tap path with a first impedance value or a first coupling factor selected to provide a first selected voltage at the signal detector to set a first automatic gain control (AGC) level for the first band; and a second impedance in the second tap path with a second impedance value or a second coupling factor selected to provide a second selected voltage at the signal detector to set a second AGC level for the second band.

Example 23 includes the repeater of Example 22, wherein the signal detector is switchably connected to the first tap path and the second tap path to enable separate band detection for the first band and the second band.

Example 24 includes the repeater of any of Examples 22 to 23, wherein the first impedance value or the first coupling factor and the second impedance value or the second coupling factor are adjusted to level a detection variance with respect to detected power levels between signals received in the first band as compared to the second band in the signal path.

Example 25 includes the repeater of any of Examples 22 to 24, wherein: the first tap path is a filtered path that includes a first band filter; and the second tap path is an unfiltered path.

Example 26 includes the repeater of any of Examples 22 to 25, wherein the signal path is an uplink signal path or a downlink signal path.

Example 27 includes the repeater of any of Examples 22 to 26, wherein: the uplink signal path is operable to direct uplink signals in band 12 (B12) or band 13 (B13); and the downlink signal path is operable to direct downlink signals in B12 or B13.

Example 28 includes the repeater of any of Examples 22 to 27, wherein the signal path is operable to direct signals in two or more spectrally adjacent bands.

Example 29 includes the repeater of any of Examples 22 to 28, wherein the signal path is operable to direct signals in two or more non-spectrally adjacent bands.

Example 30 includes the repeater of any of Examples 22 to 29, further comprising a controller configured to adjust a gain for a defined band of the signal path for network protection depending on an input or output signal level.

Example 31 includes the repeater of any of Examples 22 to 30, further comprising a controller configured to adjust a gain for a defined band of the signal path to maintain linearity for the signal path depending on an input or output signal level.

Example 32 includes the repeater of any of Examples 22 to 31, wherein the signal path includes one or more amplifiers to amplify the signals and one or more filters to filter the signals.

Example 33 includes the repeater of any of Examples 22 to 32, further comprising: a first multiband filter communicatively coupled to the signal path; and a second multiband filter communicatively coupled to the signal path.

Example 34 includes the repeater of any of Examples 22 to 33, further comprising: an inside antenna communicatively coupled to the signal path; and an outside antenna communicatively coupled to the signal path.

Example 35 includes a signal booster, comprising: a signal path operable to direct signals in two or more bands comprising at least a first band and a second band in the signal path; a first tap path communicatively coupled to the signal path; a second tap path communicatively coupled to the signal path; and a signal detector switchably connected to the first tap path and the second tap path to enable separate band detection for the first band and the second band.

Example 36 includes the signal booster of Example 35, wherein: the first tap path includes a first impedance with a first impedance value or a first coupling factor selected to provide a first selected voltage at the signal detector to set a first automatic gain control (AGC) level for the first band; and the second tap path includes a second impedance with a second impedance value or a second coupling factor selected to provide a second selected voltage at the signal detector to set a second AGC level for the second band, wherein the first impedance value or the first coupling factor and the second impedance value or the second coupling factor are adjusted to level a detection variance with respect to detected power levels between signals received in the first band as compared to the second band in the signal path.

Example 37 includes the signal booster of any of Examples 35 to 36, wherein: the first tap path includes a first resistor with a first resistance value selected to provide a first selected voltage at the signal detector to set a first automatic gain control (AGC) level for the first band; and the second tap path includes a second resistor with a second resistance value selected to provide a second selected voltage at the signal detector to set a second AGC level for the second band, wherein the first resistance value and the second resistance value are adjusted to level a detection variance with respect to detected power levels between signals received in the first band as compared to the second band in the signal path.

Example 38 includes the signal booster of any of Examples 35 to 37, wherein: the first tap path is a filtered path that includes a first band filter; and the second tap path is an unfiltered path.

Example 39 includes the signal booster of any of Examples 35 to 38, wherein the signal path is an uplink signal path or a downlink signal path.

Example 40 includes the signal booster of any of Examples 35 to 39, wherein: the uplink signal path is operable to direct uplink signals in band 12 (B12) or band 13 (B13); and the downlink signal path is operable to direct downlink signals in B12 or B13.

Example 41 includes the signal booster of any of Examples 35 to 40, further comprising a controller configured to: adjust a gain for a defined band of the signal path for network protection depending on an input or output signal level; or adjust a gain for a defined band of the signal path to maintain linearity for the signal path depending on an input or output signal level.

Example 42 includes a radio frequency (RF) signal path operable to direct signals in two or more bands, the RF signal path comprising: a first tap path communicatively coupled to the RF signal path; a second tap path communicatively coupled to the RF signal path; a signal detector connected to the first tap path and the second tap path; a first impedance in the first tap path with a first impedance value or a first coupling factor selected to provide a first selected voltage at the signal detector to set a first automatic gain control (AGC) level for a first band of the RF signal path; and a second impedance in the second tap path with a second impedance value or a second coupling factor selected to provide a second selected voltage at the signal detector to set a second AGC level for a second band of the RF signal path.

Example 43 includes the RF signal path of Example 42, wherein the signal detector is switchably connected to the first tap path and the second tap path to enable separate band detection for the first band and the second band.

Example 44 includes the RF signal path of any of Examples 42 to 43, wherein the first impedance value or the first coupling factor and the second impedance value or the second coupling factor are adjusted to level a detection variance with respect to detected power levels between signals received in the first band as compared to the second band in the RF signal path.

Example 45 includes the RF signal path of any of Examples 42 to 44, wherein: the first tap path is a filtered path that includes a first band filter; and the second tap path is an unfiltered path.

Example 46 includes the RF signal path of any of Examples 42 to 45, wherein the RF signal path is an uplink RF signal path or a downlink RF signal path.

Example 47 includes the RF signal path of any of Examples 42 to 46, wherein the RF signal path is operable to: direct signals in two or more spectrally adjacent bands; or direct signals in two or more non-spectrally adjacent bands.

Example 48 includes the RF signal path of any of Examples 42 to 47, wherein the RF signal path includes one or more amplifiers to amplify the signals and one or more filters to filter the signals.

Example 49 includes the RF signal path of any of Examples 42 to 48, wherein the RF signal path is included in a signal booster or a repeater.

Various techniques, or certain aspects or portions thereof, can take the form of program code (i.e., instructions) embodied in tangible media, such as floppy diskettes, compact disc-read-only memory (CD-ROMs), hard drives, non-transitory computer readable storage medium, or any other machine-readable storage medium wherein, when the program code is loaded into and executed by a machine, such as a computer, the machine becomes an apparatus for practicing the various techniques. Circuitry can include hardware, firmware, program code, executable code, computer instructions, and/or software. A non-transitory computer readable storage medium can be a computer readable storage medium that does not include signal. In the case of program code execution on programmable computers, the computing device can include a processor, a storage medium readable by the processor (including volatile and non-volatile memory and/or storage elements), at least one input device, and at least one output device. The volatile and non-volatile memory and/or storage elements can be a random-access memory (RAM), erasable programmable read only memory (EPROM), flash drive, optical drive, magnetic hard drive, solid state drive, or other medium for storing electronic data. One or more programs that can implement or utilize the various techniques described herein can use an application programming interface (API), reusable controls, and the like. Such programs can be implemented in a high level procedural or object oriented programming language to communicate with a computer system. However, the program(s) can be implemented in assembly or machine language, if desired. In any case, the language can be a compiled or interpreted language, and combined with hardware implementations.

As used herein, the term processor can include general purpose processors, specialized processors such as VLSI, FPGAs, or other types of specialized processors, as well as base band processors used in transceivers to send, receive, and process wireless communications.

It should be understood that many of the functional units described in this specification have been labeled as modules, in order to more particularly emphasize their implementation independence. For example, a module can be implemented as a hardware circuit comprising custom very-large-scale integration (VLSI) circuits or gate arrays, off-the-shelf semiconductors such as logic chips, transistors, or other discrete components. A module can also be implemented in programmable hardware devices such as field programmable gate arrays, programmable array logic, programmable logic devices or the like.

In one example, multiple hardware circuits or multiple processors can be used to implement the functional units described in this specification. For example, a first hardware circuit or a first processor can be used to perform processing operations and a second hardware circuit or a second processor (e.g., a transceiver or a baseband processor) can be used to communicate with other entities. The first hardware circuit and the second hardware circuit can be incorporated into a single hardware circuit, or alternatively, the first hardware circuit and the second hardware circuit can be separate hardware circuits.

Modules can also be implemented in software for execution by various types of processors. An identified module of executable code can, for instance, comprise one or more physical or logical blocks of computer instructions, which can, for instance, be organized as an object, procedure, or function. Nevertheless, the executables of an identified module need not be physically located together, but can comprise disparate instructions stored in different locations which, when joined logically together, comprise the module and achieve the stated purpose for the module.

Indeed, a module of executable code can be a single instruction, or many instructions, and can even be distributed over several different code segments, among different programs, and across several memory devices. Similarly, operational data can be identified and illustrated herein within modules, and can be embodied in any suitable form and organized within any suitable type of data structure. The operational data can be collected as a single data set, or can be distributed over different locations including over different storage devices, and can exist, at least partially, merely as electronic signals on a system or network. The modules can be passive or active, including agents operable to perform desired functions.

Reference throughout this specification to "an example" or "exemplary" means that a particular feature, structure, or characteristic described in connection with the example is included in at least one embodiment of the present invention. Thus, appearances of the phrases "in an example" or the word "exemplary" in various places throughout this specification are not necessarily all referring to the same embodiment.

As used herein, a plurality of items, structural elements, compositional elements, and/or materials can be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention can be referred to herein along with alternatives for the various components thereof. It is understood that such embodiments, examples, and alternatives are not to be construed as defacto equivalents of one another, but are to be considered as separate and autonomous representations of the present invention.

Furthermore, the described features, structures, or characteristics can be combined in any suitable manner in one or more embodiments. In the following description, numerous specific details are provided, such as examples of layouts, distances, network examples, etc., to provide a thorough understanding of embodiments of the invention. One skilled in the relevant art will recognize, however, that the invention can be practiced without one or more of the specific details, or with other methods, components, layouts, etc. In other instances, well-known structures, materials, or operations are not shown or described in detail to avoid obscuring aspects of the invention.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

What is claimed is:

1. A signal booster, comprising:
   a first signal path that includes one or more amplifiers and one or more band pass filters, wherein the first signal path is configured to amplify and filter first signals in one or more selected bands;
   a second signal path that includes one or more amplifiers and one or more band pass filters, wherein the second signal path is configured to amplify and filter received second signals in a plurality of selected bands, wherein the second signal path combines at least a first band and a second band in the plurality of selected bands; and
   a controller operable to perform network protection by adjusting a gain or noise power for at least one of a first band or a second band in the first signal path, wherein the gain or noise power is adjusted for the first band in the first signal path using control information associated with a received signal in the first band of the second signal path, wherein the gain or noise power is adjusted for the second band in the first signal path using control information associated with a received signal in the second band of the second signal path.

2. The signal booster of claim 1, wherein the control information associated with the received signal in the first band of the second signal path and the control information associated with the received signal in the second band of the second signal path includes a received signal strength indication (RSSI).

3. The signal booster of claim 1, further comprising a signal detector operable to:
   detect the control information associated with the received signal in the first band of the second signal path; and
   detect the control information associated with the received signal in the second band of the second signal path,
   wherein the signal booster is configured to switch two or more bandpass filters (BPFs) in and out to enable the signal detector to detect control information associated with different received signals in different bands.

4. The signal booster of claim 1, wherein the two or more BPFs are switched in and out in the first signal path or the second signal path in order to detect the control information.

5. The signal booster of claim 1, further comprising:
   a first signal detector operable to detect the control information associated with the received signal in the first band of the second signal path; and
   a second signal detector operable to detect the control information associated with the received signal in the second band of the second signal path.

6. The signal booster of claim 1, wherein the gain or noise power for the first band in the first signal path is controlled independent of the gain or noise power for the second band in the first signal path.

7. The signal booster of claim 1, wherein:
   the first band of the first signal path and the first band of the second signal path is band 12 (B12); and
   the second band of the first signal path and the second band of the second signal path is band 13 (B13).

8. The signal booster of claim 1, wherein the second signal path is configured to direct a signal in the first band to a bandpass filter associated with the second band when a power level of the signal is greater than a defined threshold, wherein the bandpass filter associated with the second band causes a reduction in the power level of the signal to avoid performing automatic gain control (AGC) for the first band.

9. The signal booster of claim 1, wherein:
   the second signal path is configured to direct a signal in the first band to a signal detector via a bandpass filter associated with the first band, wherein a power level of the signal in relation to a defined threshold causes the controller to perform network protection for the first band in the first signal path; or
   the second signal path is configured to direct the signal in the second band to the signal detector via a bandpass filter associated with the second band, wherein a power level of the signal in relation to a defined threshold causes the controller to perform network protection for the second band in the second signal path.

10. The signal booster of claim 1, wherein the signal booster is a cellular signal booster configured to amplify cellular signals and retransmit amplified cellular signals.

11. The signal booster of claim 1, further comprising:
    an inside antenna to receive uplink signals from a mobile device; and
    an outside antenna to transmit amplified and filtered uplink signals to a base station.

12. The signal booster of claim 1, further comprising:
an outside antenna to receive downlink signals from a base station; and
an inside antenna to transmit amplified and filtered downlink signals to a mobile device.

13. A cellular signal booster operable to amplify cellular signals, comprising:
a downlink cellular signal path configured to amplify and filter a received downlink cellular signal in a plurality of selected bands, wherein the downlink signal path combines at least a first band and a second band in the plurality of selected bands; and
a controller operable to perform network protection by adjusting an uplink gain or noise power for at least one of a first band or a second band in an uplink signal path, wherein the uplink gain or noise power is adjusted for the first band in the uplink signal path or the second band in the uplink signal path using a signal strength associated with the received downlink cellular signal on the downlink cellular signal path.

14. The cellular signal booster of claim 13, further comprising a cellular signal detector operable to:
detect the signal strength associated with the received downlink cellular signal in the first band of the downlink signal path; and
detect the signal strength associated with the received downlink cellular signal in the second band of the downlink signal path,
wherein the cellular signal booster is configured to switch two or more bandpass filters (BPFs) in and out to enable the cellular signal detector to detect control information associated with different received downlink cellular signals in different bands.

15. The cellular signal booster of claim 13, further comprising:
a first cellular signal detector operable to detect the signal strength associated with the received downlink cellular signal in the first band of the downlink signal path; and
a second cellular signal detector operable to detect the signal strength associated with the received downlink cellular signal in the second band of the downlink signal path.

16. The cellular signal booster of claim 13, wherein:
the first band of the uplink signal path and the first band of the downlink signal path is band 12 (B12); and
the second band of the uplink signal path and the second band of the downlink signal path is band 13 (B13).

17. A system operable to transmit amplified signals, the system comprising:
an uplink signal path configured to amplify and filter uplink signals in one or more selected bands;
a downlink signal path configured to amplify and filter received downlink signals in two or more selected bands, wherein the downlink signal path combines a first band and a second band; and
a controller operable to perform network protection by adjusting an uplink gain or noise power for at least one of a first band in the uplink signal path or a second band in the uplink signal path, wherein the uplink gain or noise power is adjusted for the first band in the uplink signal path using control information associated with a received downlink signal in the first band of the downlink signal path, wherein the uplink gain or noise power is adjusted for the second band in the uplink signal path using control information associated with a received downlink signal in the second band of the downlink signal path.

18. The system of claim 17, wherein the control information associated with the received downlink signal in the first band of the downlink signal path and the control information associated with the received downlink signal in the second band of the downlink signal path includes a received signal strength indication (RSSI).

19. The system of claim 17, wherein the uplink gain or noise power for the first band in the uplink signal path is controlled independent of the uplink gain or noise power for the second band in the uplink signal path.

20. The system of claim 17, further comprising:
an outside antenna configured to receive downlink signals from a base station and transmit amplified and filtered uplink signals to the base station; and
an inside antenna configured to receive uplink signals from a mobile device and transmit amplified and filtered downlink signals to the mobile device.

21. The system of claim 17, wherein:
the first band of the uplink signal path and the first band of the downlink signal path is band 12 (B12); and
the second band of the uplink signal path and the second band of the downlink signal path is band 13 (B13).

* * * * *